United States Patent
Lohe et al.

(10) Patent No.: US 11,549,994 B1
(45) Date of Patent: Jan. 10, 2023

(54) PACK MONITORING UNIT FOR AN ELECTRIC AIRCRAFT BATTERY PACK AND METHODS OF USE FOR BATTERY MANAGEMENT

(71) Applicant: BETA AIR, LLC, South Burlington, VT (US)

(72) Inventors: Braedon Lohe, Essex Junction, VT (US); Cullen Jemison, Winooski, VT (US); Andrew Giroux, Georgia, VT (US); Tom Hughes, South Burlington, VT (US)

(73) Assignee: BETA AIR, LLC, South Burlington, VT (US)

( * ) Notice: Subject to any disclaimer, the term of this patent is extended or adjusted under 35 U.S.C. 154(b) by 0 days.

(21) Appl. No.: 17/529,583

(22) Filed: Nov. 18, 2021

(51) Int. Cl.
| | |
|---|---|
| *H02H 7/00* | (2006.01) |
| *G01R 31/396* | (2019.01) |
| *G01R 31/387* | (2019.01) |
| *H02H 7/18* | (2006.01) |
| *G01R 31/392* | (2019.01) |
| *B64D 47/00* | (2006.01) |

(52) U.S. Cl.
CPC ......... *G01R 31/396* (2019.01); *G01R 31/387* (2019.01); *G01R 31/392* (2019.01); *H02H 7/18* (2013.01); *B64D 47/00* (2013.01)

(58) Field of Classification Search
None
See application file for complete search history.

(56) References Cited

U.S. PATENT DOCUMENTS

| | | | |
|---|---|---|---|
| 10,031,186 B2 | 7/2018 | Neelam et al. | |
| 10,302,703 B2 | 5/2019 | Fleischer et al. | |
| 10,440,542 B2 | 10/2019 | Thomas et al. | |
| 2012/0119709 A1* | 5/2012 | Mull | H02J 7/0016 320/149 |
| 2017/0168537 A1* | 6/2017 | Jäntti | G06F 1/28 |
| 2018/0267591 A1* | 9/2018 | Kurian | G06F 1/3212 |
| 2019/0339334 A1 | 11/2019 | Mikolajczak | |
| 2019/0369711 A1* | 12/2019 | Wang | G06F 1/3212 |
| 2020/0036056 A1 | 1/2020 | Thomas et al. | |
| 2020/0127483 A1 | 4/2020 | Kim et al. | |
| 2020/0274203 A1 | 8/2020 | Kirleis et al. | |
| 2020/0294401 A1 | 9/2020 | Kerecsen | |
| 2021/0003638 A1 | 1/2021 | Mizoguchi | |
| 2021/0313804 A1* | 10/2021 | Wiegman | H02J 1/10 |

OTHER PUBLICATIONS

Press, BatMon: Smartify your drone battery, Jan. 22, 2020.
Unmanned Systems Technology, Battery Management Systems BMS & Battery Packs, Dec. 31, 2021.

* cited by examiner

*Primary Examiner* — Stephen W Jackson
(74) *Attorney, Agent, or Firm* — Caldwell Intellectual Property Law

(57) ABSTRACT

An electric aircraft battery pack that includes an integrated battery management component, which determines if a power supply connection between the battery pack and the electric aircraft should be terminated due to a failure, defect, or malfunction of the battery pack, such as a failure of a battery module of the battery pack.

20 Claims, 9 Drawing Sheets

PACK MONITORING UNIT FOR AN ELECTRIC AIRCRAFT BATTERY PACK AND METHODS OF USE FOR BATTERY MANAGEMENT

FIELD OF THE INVENTION

The present invention generally relates to the field of electric aircrafts. In particular, the present invention is directed to a battery pack monitoring unit and methods of use for battery management.

BACKGROUND

The burgeoning of electric vertical take-off and landing (eVTOL) aircraft technologies promises an unprecedented forward leap in energy efficiency, cost savings, and the potential of future autonomous and unmanned aircraft. However, the technology of eVTOL aircraft is still lacking in crucial areas of energy source solutions.

SUMMARY OF THE DISCLOSURE

In an aspect, a pack monitoring unit (PMU) for an electric aircraft battery pack is provided. The PMU includes: a controller, wherein the controller is configured to: receive a measurement datum for a battery module of a battery pack; identify an operating condition of the battery module as a function of the measurement datum; determine a critical event element if the operating condition is outside of a predetermined threshold; and generate an action command and lockout flag as a function of the critical event element; a communication component, wherein the communication component is configured to transmit the action command to a high voltage disconnect of the battery module, wherein the action command configures the high voltage disconnect to terminate a power supply between the battery module and a corresponding electric aircraft; and a memory component, wherein the memory component is configured to store the lockout flag persistently.

In an aspect, a method of battery management using a pack monitoring unit (PMU) for an electric aircraft battery pack, the method including: receiving, by a controller of a PMU, a measurement datum for a battery module of a battery pack; identifying, by the controller, an operating condition of the battery module as a function of the measurement datum; determining, by the controller, a critical event element if the operating condition is outside of a predetermined threshold; and generating, by the controller, an action command and lockout flag as a function of the critical event element; transmitting, by a communication component of the PMU, the action command to a high voltage disconnect of the battery module, wherein the action command configures the high voltage disconnect to terminate a power supply between the battery module and a corresponding electric aircraft; and storing, by a memory component of the PMU, the lockout flag persistently.

These and other aspects and features of non-limiting embodiments of the present invention will become apparent to those skilled in the art upon review of the following description of specific non-limiting embodiments of the invention in conjunction with the accompanying drawings.

BRIEF DESCRIPTION OF THE DRAWINGS

For the purpose of illustrating the invention, the drawings show aspects of one or more embodiments of the invention. However, it should be understood that the present invention is not limited to the precise arrangements and instrumentalities shown in the drawings, wherein.

The drawings are not necessarily to scale and may be illustrated by phantom lines, diagrammatic representations and fragmentary views. In certain instances, details that are not necessary for an understanding of the embodiments or that render other details difficult to perceive may have been omitted.

DETAILED DESCRIPTION

Battery management systems and related techniques are provided to improve the monitoring and controlling of an electric aircraft energy source. More specifically, a pack monitoring unit (PMU) is configured to measure a condition parameter of a component of an electric aircraft battery pack to ensure the battery pack is operating properly and to prevent or reduce damage to the electric aircraft if the battery pack experiences catastrophic failure.

In the following description, for the purposes of explanation, numerous specific details are set forth in order to provide a thorough understanding of the present invention. It will be apparent, however, that the present invention may be practiced without these specific details. As used herein, the word "exemplary" or "illustrative" means "serving as an example, instance, or illustration." Any implementation described herein as "exemplary" or "illustrative" is not necessarily to be construed as preferred or advantageous over other implementations. Furthermore, there is no intention to be bound by any expressed or implied theory presented in the preceding technical field, background, brief summary or the following detailed description. It is also to be understood that the specific devices and processes illustrated in the attached drawings, and described in the following specification, are simply embodiments of the inventive concepts defined in the appended claims. Hence, specific dimensions and other physical characteristics relating to the embodiments disclosed herein are not to be considered as limiting, unless the claims expressly state otherwise.

Figure 1:
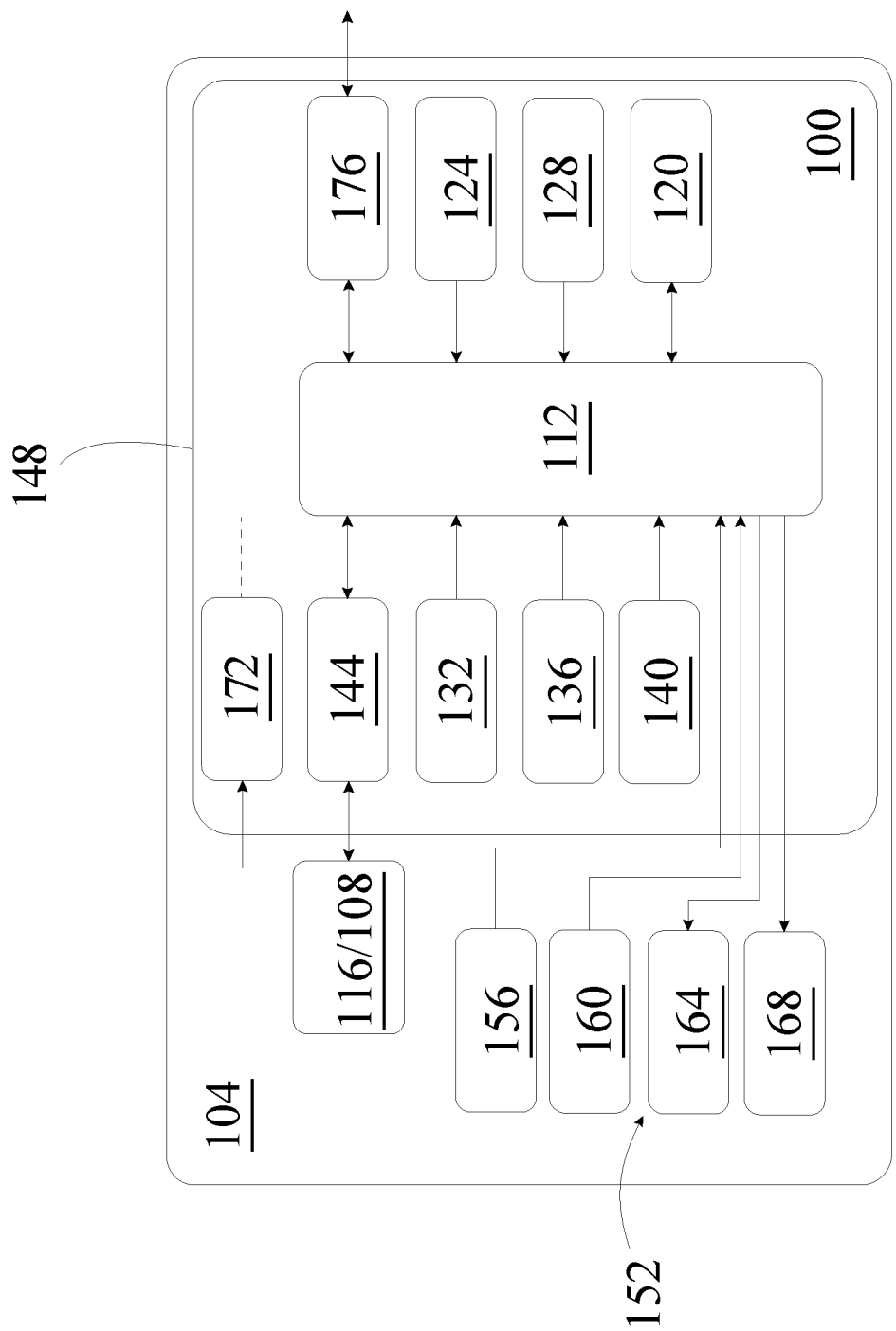
FIG. 1 is a block diagram of another exemplary embodiment a pack monitor unit in one or more aspects of the present disclosure.

Referring now to FIG. 1, an exemplary embodiment of a pack monitoring unit (PMU) 100 is shown in accordance with one or more embodiments of the present disclosure. In one or more embodiments, PMU 100 may be implemented in a battery management system (shown in FIG. 3) to monitor a battery pack 104 and/or components of battery pack 104. In one or more embodiments, PMU 100 may receive a condition parameter from a sensor that is configured to detect a condition parameter of battery pack 104. In one or more embodiments, PMU 100 may include a sensor. In other embodiments, sensor may be remote to PMU 100, for example and without limitation, a sensor of a module monitor unit (MMU) 116. As used in this disclosure, a "condition parameter" is a detected electrical or physical input, characteristic, and/or phenomenon related to a state of a battery pack. For example, and without limitation, sensor 108 may measure a condition parameter, such as temperature, of a battery module terminal and/or a battery cell of battery pack 104. A condition parameter may include a temperature, a voltage, a current, a pressure, a gas level, a moisture/humidity level, an orientation, or the like, of battery pack 104 and/or a component of battery pack 104, such as a battery module or a battery cell (shown in FIG. 4).

In one or more embodiments, condition parameter of battery module 204 may be detected by sensor 108, which may be communicatively connected to an MMU 116 that is incorporated in a battery module, as discussed further below in this disclosure. Sensor 108 may include a sensor suite 200 (shown in FIG. 2) or one or more individual sensors (shown in FIG. 1), which may include, but are not limited to, one or more temperature sensors, voltmeters, current sensors, hydrometers, infrared sensors, photoelectric sensors, ionization smoke sensors, motion sensors, pressure sensors, radiation sensors, level sensors, imaging devices, moisture sensors, gas and chemical sensors, flame sensors, electrical sensors, imaging sensors, force sensors, Hall sensors, bolometers, and the like. Sensor 108 may be a contact or a non-contact sensor. For example, and without limitation, sensor 108 may be connected to battery module and/or battery cell of battery pack 104. In other embodiments, sensor 108 may be remote to battery module and/or battery cell.

Still referring to FIG. 1, sensor 108 may generate a measurement datum, which is a function of a detected condition parameter. For the purposes of this disclosure, "measurement datum" is an electronic signal representing an information and/or a parameter of a detected electrical and/or physical characteristic and/or phenomenon correlated with a state of a battery pack. For example, and without limitation, a sensor signal output includes a measurement datum. In one or more embodiments, measurement datum may include data of a condition parameter regarding a detected state of a battery cell. In one or more embodiments, measurement datum may include a quantitative and/or numerical value representing a temperature, pressure, moisture level, gas level, orientation, or the like. For example, and without limitation, a measurement datum may include a temperature of 75° F. In one or more embodiments, sensor 108 is configured to transmit measurement datum to PMU 100. PMU 100 is configured to receive measurement datum and process the received measurement datum. Though sensor 108 is described as providing one or more sensors, PMU 100 may also include a sensor that detects a parameter condition of battery pack 104 and generates a measurement datum to transmit to controller 112. For example, PMU 100 may include a pressure sensor 124, a real time clock (RTC) sensor 128 that is used to track the current time and date, a humidity sensor 132, an accelerometer/IMU 136, or other sensor 140.

Still referring to FIG. 1, PMU 100 includes a controller 112. Sensor 108 may be communicatively connected to controller 112 of PMU 100 so that sensor 108 may transmit/receive signals to/from controller 112. Signals, such as signals of sensor 108 and/or controller 112, may include electrical, electromagnetic, visual, audio, radio waves, or another undisclosed signal type alone or in combination. In one or more embodiments, communicatively connecting is a process whereby one device, component, or circuit is able to receive data from and/or transmit data to another device, component, or circuit. In an embodiment, communicative connecting includes electrically connecting at least an output of one device, component, or circuit to at least an input of another device, component, or circuit. In one or more embodiments, controller 112 is configured to receive measurement datum from sensor 108. For example, PMU 100a may receive a plurality of measurement data from MMU 116a (shown in FIG. 2). Similarly, PMU 100b may receive a plurality of measurement data from MMU 116b (shown in FIG. 2). In one or more embodiments, PMU 100 receives measurement datum from MMU 116 via a communication component 144. In one or more embodiments, communication component 144 may be a transceiver. For example, and without limitation, communication component 144 may include an isoSPI communications interface.

In one or more embodiments, controller 112 of PMU 100 is configured to identify an operating condition of battery module 108 as a function of measurement datum. For the purposes of this disclosure, an "operating condition" is a state and/or working order of a battery pack and/or any components thereof. For example, and without limitation, an operating condition may include a state of charge (SOC), a depth of discharge (DOD), a temperature reading, a moisture/humidity level, a gas level, a chemical level, or the like. In one or more embodiments, controller 112 of PMU 100 is configured to determine a critical event element if operating condition is outside of a predetermined threshold (also referred to herein as a "threshold"). For the purposes of this disclosure, a "critical event element" is a failure and/or critical operating condition of a battery pack and/or components thereof that may be harmful to the battery pack and/or corresponding electric aircraft. In one or more embodiments, a critical event element may include an overcurrent, undercurrent, overvoltage, overheating, high moisture levels, byproduct presence, low SOC, high DOD, or the like. For instance, and without limitation, if an identified operating condition, such as a temperature reading of 50° F., of a battery cell of battery pack 104, is outside of a predetermined threshold, such as 75° F. to 90° F., where 75° F. is the temperature threshold and 90° F. is the upper temperature threshold, then a critical event element is determined by controller 112 of PMU 100 since 50° F. is beyond the lower temperature threshold. In another example, and without limitation, PMU 100 may use measurement datum from MMU 116 to identify a temperature of 95° F. for a battery module terminal. If the predetermined threshold is, for example, 90° F., then the determined operating condition exceeds the predetermined threshold, and a critical event element is determined by controller 112, such as a risk of a short at the terminal of a battery module 204 (shown in FIGS. 2 and 4). As used in this disclosure, a "predetermined threshold" is a limit and/or range of an acceptable quantitative value and/or combination of values such as an n-tuple or function such as linear function of values, and/or representation related to a normal operating condition of a battery pack and/or components thereof. In one or more embodiments, an operating condition outside of the threshold is a critical operating condition that indicates that a battery pack is malfunctioning, which triggers a critical event element. An operating condition within the threshold is a normal operating condition that indicates that battery pack is working properly and that no action is required by PMU 100 and/or a user. For example, and without limitation, if an operating condition of temperature exceeds a predetermined threshold, as described above in this disclosure, then a battery pack is considered to be operating at a critical operating condition and may be at risk of overheating and experiencing a catastrophic failure.

In one or more embodiments, controller 112 of PMU 100 is configured to generate an action command if critical event element is determined by controller 112. For the purposes of this disclosure, an "action command" is a control signal generated by a controller that provides instructions related to reparative action needed to prevent and/or reduce damage to a battery back, components thereof, and/or aircraft as a result of a critical operating condition of the battery pack. Continuing the previously described example above, if an identified operating condition includes a temperature of 95° F., which exceeds predetermined threshold, then controller 112 may determine a critical event element indicating that battery pack 104 is working at a critical temperature level and at risk of catastrophic failure, such as short circuiting or catching fire. In one or more embodiments, critical event elements may include high shock/drop, overtemperature, undervoltage, high moisture, contactor welding, SOC unbalance, and the like. In one or more embodiments, an action command may include an instruction to terminate power supply from battery pack 104 to electric aircraft, power off battery pack 104, terminate a connection between one or more battery cells 404 (shown in FIG. 4), initiate a temperature regulating system, such as a coolant system or opening of vents to circulate air around or through battery pack 104, or the like. In one or more embodiments, controller 112 may conduct reparative procedures via action command after determining critical even element to reduce or eliminate critical element event. For example, and without limitation, controller 112 may initiate reparative procedure of a circulation of a coolant through a cooling system of battery pack 104 to lower the temperature if a battery module if the determined temperature of the battery module exceeds a predetermined threshold. In another example, and without limitation, if a gas and/or chemical accumulation level is detected that is then determined to exceed a predetermined threshold, then high voltage disconnect may terminate power supply connection 112. According to some embodiments, a vent of battery pack 104 may be opened to circulate air through battery pack 104 and reduce detected gas levels. Additionally, vent of battery module 204 may have a vacuum applied to aid in venting of ejecta. Vacuum pressure differential may range from 0.1"Hg to 36"Hg.

In one or more embodiments, a critical event alert may be generated by controller 112 of PMU 100 in addition to an action command. The critical event alert may include a lockout feature, which is an alert that remains even after rebooting of the battery pack and/or corresponding systems. Lockout feature may only be removed by a manual override or once the critical event element has ceased and is no longer determined by controller 112. In one or more embodiments, controller 112 may continuously monitor battery pack 104 and components thereof so that an operating condition is known at all times.

In one or more embodiments, controller 112 may include a computing device, which may be implemented in any manner suitable for implementation of a computing device as described in this disclosure, a microcontroller, a logic device, a central processing unit (CPU), a microprocessor, a digital signal processor (DSP), an application specific integrated circuit (ASIC), a control circuit, a combination thereof, or the like. In one or more embodiments, output signals from various components of battery pack 104 may be analog or digital. Controller 112 may convert output signals from MMU 100, sensor 108, and/or sensors 124,128,132, 136,140 to a usable form by the destination of those signals. The usable form of output signals from MMUs and/or sensors, through processor may be either digital, analog, a combination thereof, or an otherwise unstated form. Processing may be configured to trim, offset, or otherwise compensate the outputs of sensor. Based on MMU and/or sensor output, controller can determine the output to send to a downstream component. Processor can include signal amplification, operational amplifier (Op-Amp), filter, digital/analog conversion, linearization circuit, current-voltage change circuits, resistance change circuits such as Wheatstone Bridge, an error compensator circuit, a combination thereof or otherwise undisclosed components. In one or more embodiments, PMU 100 may run state estimation algorithms. In one or more embodiments, PMU 100 may communicate with MMU 116 and/or sensor 108 via a communication component 144. For example, and without limitation, PMU may communicate with MMU 112 using an isoSPI transceiver.

In one or more embodiments, controller 112 may be designed and/or configured to perform any method, method step, or sequence of method steps in any embodiment described in this disclosure, in any order and with any degree of repetition. For instance, controller 112 may be configured to perform a single step or sequence repeatedly until a desired or commanded outcome is achieved; repetition of a step or a sequence of steps may be performed iteratively and/or recursively using outputs of previous repetitions as inputs to subsequent repetitions, aggregating inputs and/or outputs of repetitions to produce an aggregate result, reduction or decrement of one or more variables such as global variables, and/or division of a larger processing task into a set of iteratively addressed smaller processing tasks. controller 112 may perform any step or sequence of steps as described in this disclosure in parallel, such as simultaneously and/or substantially simultaneously performing a step two or more times using two or more parallel threads, processor cores, or the like; division of tasks between parallel threads and/or processes may be performed according to any protocol suitable for division of tasks between iterations. Persons skilled in the art, upon reviewing the entirety of this disclosure, will be aware of various ways in which steps, sequences of steps, processing tasks, and/or data may be subdivided, shared, or otherwise dealt with using iteration, recursion, and/or parallel processing.

Referring again to FIG. 1, PMU 100 may include a memory component 120 configured to store data related to battery pack 104 and/or components thereof. In one or more embodiments, memory component 120 may store battery pack data. Battery pack data may include generated data, detected data, measured data, inputted data, determined data and the like. For example, measurement datum from MMU 112 and or a sensor may be stored in memory component 120. In another example, critical event element and/or corresponding lockout flag may be stored in memory component 120. Battery pack data may also include inputted datum, which may include total flight hours that battery pack 104 and/or electric aircraft, such as electric aircraft 208 (shown in FIG. 2), have been operating, flight plan of electric aircraft, battery pack identification, battery pack verification, a battery pack maintenance history, battery pack specifications, or the like. In one or more embodiments, battery pack maintenance history may include mechanical failures and technician resolutions thereof, electrical failures and technician resolutions thereof. In one or more embodiments, memory component 120 may be communicatively connected to sensors, such as sensor 108, that detect, measure, and obtain a plurality of measurements, which may include current, voltage, resistance, impedance, coulombs, watts, temperature, moisture/humidity, or a combination thereof. Additionally or alternatively, memory component 120 may be communicatively connected to a sensor suite consistent with this disclosure to measure physical and/or electrical characteristics. In one or more embodiments, memory component 120 may store the battery pack data that includes a predetermined threshold consistent with this disclosure. The moisture-level threshold may include an absolute, relative, and/or specific moisture-level threshold. Battery pack 104 may be designed to the Federal Aviation Administration (FAA)'s Design Assurance Level A (DAL-A), using redundant DAL-B subsystems.

In one or more embodiments, memory component 120 may be configured to save measurement datum, operating condition, critical event element, and the like periodically in regular intervals to memory component 120. "Regular intervals", for the purposes of this disclosure, refers to an event taking place repeatedly after a certain amount of elapsed time. In one or more embodiments, PMU 100 may include a timer that works in conjunction to determine regular intervals. In other embodiments, PMU may continuously update operating condition or critical event element and, thus, continuously store data related the information in memory component. A Timer may include a timing circuit, internal clock, or other circuit, component, or part configured to keep track of elapsed time and/or time of day. For example, in non-limiting embodiments, data storage system 120 may save the first and second battery pack data every 30 seconds, every minute, every 30 minutes, or another time period according to timer. Additionally or alternatively, memory component 120 may save battery pack data after certain events occur, for example, in non-limiting embodiments, each power cycle, landing of the electric aircraft, when battery pack is charging or discharging, a failure of battery module, a malfunction of battery module, a critical event element, or scheduled maintenance periods. In non-limiting embodiments, battery pack 104 phenomena may be continuously measured and stored at an intermediary storage location, and then permanently saved by memory component 120 at a later time, like at a regular interval or after an event has taken place as disclosed hereinabove. Additionally or alternatively, data storage system may be configured to save battery pack data at a predetermined time. "Predetermined time", for the purposes of this disclosure, refers to an internal clock within battery pack commanding memory component 120 to save battery pack data at that time.

Memory component 120 may include a solid-state memory or tape hard drive. Memory component 120 may be communicatively connected to PMU 100 and may be configured to receive electrical signals related to physical or electrical phenomenon measured and store those electrical signals as battery module data. Alternatively, memory component 120 may be a plurality of discrete memory components that are physically and electrically isolated from each other. One of ordinary skill in the art would understand the virtually limitless arrangements of data stores with which battery pack 104 could employ to store battery pack data.

In one or more embodiments, PMU 100 may be configured to communicate with an electric aircraft, such as a flight controller of electric aircraft, using a controller area network (CAN), such as by using a CAN transceiver 176. In one or more embodiments, controller area network may include a bus. Bus may include an electrical bus. Bus may refer to power busses, audio busses, video busses, computing address busses, and/or data busses. Bus may be additionally or alternatively responsible for conveying electrical signals generated by any number of components within battery pack 104 to any destination on or offboard an electric aircraft. PMU 100 may include wiring or conductive surfaces only in portions required to electrically couple bus to electrical power or necessary circuits to convey that power or signals to their destinations. In one or more embodiments, PMU 100 may transmit action command via CAN transceiver 176 and/or an alert to an electric aircraft. For example, and without limitation, PMU 100 may transmit an alert to a user interface, such as a display, of an electric aircraft to indicate to a user that a critical event element has been determined. In one or more embodiments, PMU 100 may also use CAN transceiver 176 to transmit an alert to a remote user device, such as a laptop, mobile device, tablet, or the like.

In one or more embodiments, PMU 100 may include a housing 148. In one or more embodiments, housing 148 may include materials which possess characteristics suitable for thermal insulation, such as fiberglass, iron fibers, polystyrene foam, and thin plastic films, to name a few. Housing 148 may also include polyvinyl chloride (PVC), glass, asbestos, rigid laminate, varnish, resin, paper, Teflon, rubber, and mechanical lamina to physically isolate components of battery pack 104 from external components. In one or more embodiments, housing 148 may also include layers that separate individual components of PMU 100, such as components described above in this disclosure. As understood by one skilled in the art, housing 148 may be any shape or size suitable to attached to a battery module, such as battery module 204 of FIG. 2, of battery pack 104. In one or more embodiments, controller 112, memory component 120, sensor 108, or the like may be at least partially disposed within housing 116.

In one or more embodiments, PMU 100 may be in communication with a high voltage disconnect of battery pack 104. In one or more embodiments, high voltage disconnect may include a bus. A "bus", for the purposes of this disclosure and in electrical parlance is any common connection to which any number of loads, which may be connected in parallel, and share a relatively similar voltage may be electrically coupled. Bus may be responsible for conveying electrical energy stored in battery pack 104 to at least a portion of an electric aircraft, as discussed previously in this disclosure. High voltage disconnect 152 may include a ground fault detection 156, an HV (high voltage) current sense 160, an HV pyro fuse 164, an HV contactor 168, and the like. High voltage disconnect 152 may physically and/or electrically breaks power supply communication between electric aircraft and battery module of battery pack 104. In one or more embodiments, in one or more embodiments, the termination of a power supply connection between high voltage disconnect 152 and electric aircraft may be restored by high voltage disconnect 152 once PMU 100 no longer determined a critical event element. In other embodiments, a power supply connection may need to be restored manually, such as by a user. In one or more embodiments, PMU 100 may also include a switching regulator, which is configured to receive power from a battery module of battery pack 104. Thus, PMU 100 may be powered by energy by battery pack 104.

Figure 2:
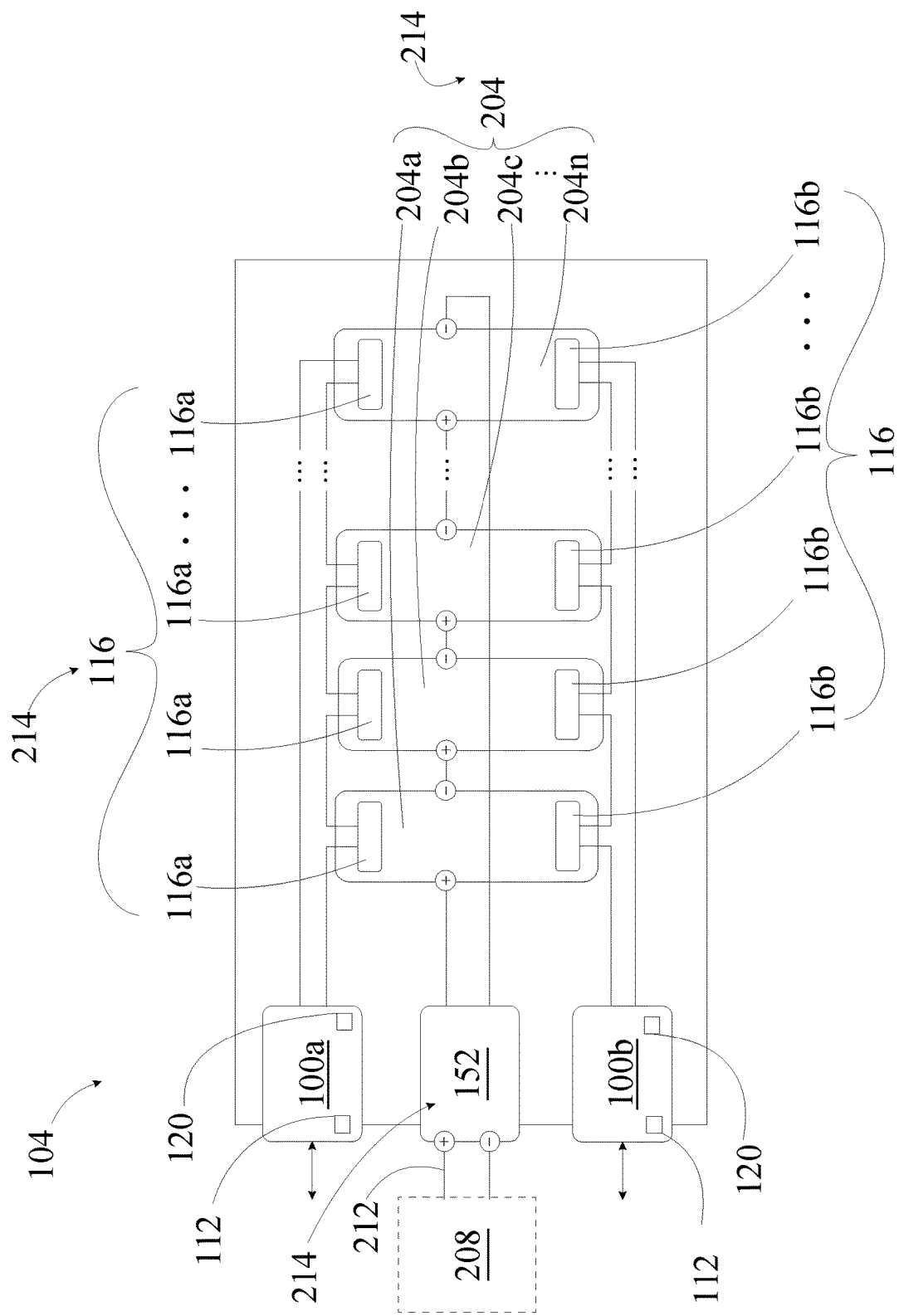
FIG. 2 is an illustration of an exemplary embodiment of a sensor suite in partial cut-off view in one or more aspects of the present disclosure.

Referring now to FIG. 2, an exemplary embodiment of a battery pack 104 is presented in accordance with one or more embodiments of the present disclosure. In one or more embodiments, battery pack 104 may include a battery module 204, which is configured to provide energy to an electric aircraft 208 via a power supply connection 212. For the purposes of this disclosure, a "power supply connection" is an electrical and/or physical communication between a battery module 204 and electric aircraft 208 that powers electric aircraft 208 and/or electric aircraft subsystems for operation. In one or more embodiments, battery pack 104 may include a plurality of battery modules, such as modules 204a-n. For example, and without limitation, battery pack 104 may include fourteen battery modules. In one or more embodiments, each battery module 204a-n may include a battery cell, as shown in FIG. 5B. For example, and without limitation, battery module 204 may include a plurality of battery cells.

Still referring to FIG. 2, battery pack 104 includes a battery management component 214 (also referred to herein as a "management component"). In one or more embodiments, battery management component 214 may be integrated into battery pack 104 in a portion of battery pack 104 or a component thereof. In an exemplary embodiment, and without limitation, management component 220 may be disposed on a first end of battery pack 104. One of ordinary skill in the art will appreciate that there are various areas in and on a battery pack and/or subassemblies thereof that may include battery management component 214. In one or more embodiments, battery management component 214 may be disposed directly over, adjacent to, facing, and/or near a battery module and specifically at least a portion of a battery cell, the arrangement of which will be disclosed with greater detail in reference to FIG. 4. In one or more embodiments, battery management component 214 includes PMU 100, MMU 116, and high voltage disconnect 152. In one or more embodiments, battery management component 214 may also include a sensor 108. For example, and without limitation, battery management component 214 may include a sensor suite 300 having a plurality of sensors, as discussed previously in this disclosure, as shown in FIG. 3.

In one or more embodiments, battery management component 214 includes module MMU 116, which is mechanically connected and communicatively connected to battery module 204. As used herein, "communicatively connected" is a process whereby one device, component, or circuit is able to receive data from and/or transmit data to another device, component, or circuit. In an embodiment, communicative connecting includes electrically connecting at least an output of one device, component, or circuit to at least an input of another device, component, or circuit. In one or more embodiments, MMU 116 is configured to detect a measurement characteristic of battery module 204 of battery pack 104. For the purposes of this disclosure, a "measurement characteristic" is detected electrical or physical input and/or phenomenon related to a condition state of battery pack 104. A condition state may include detectable information related to, for example, a temperature, a moisture level, a humidity, a voltage, a current, vent gas, vibrations, chemical content, or other measurable characteristics of battery pack 104, battery module 204, and/or a battery cell. For example, and without limitation, MMU 116 may detect and/or measure a measurement characteristic, such as a temperature, of battery module 204. In one or more embodiments, a condition state of battery pack 104 may include a condition state of a battery module 204 and/or a battery cell. In one or more embodiments, MMU 116 may include a sensor, which may be configured to detect and/or measure measurement characteristic. As used in this disclosure, a "sensor" is a device that is configured to detect an input and/or a phenomenon and transmit information and/or datum related to the detection, as discussed further below in this disclosure. Output signal may include a sensor signal, which transmits information and/or datum related to the sensor detection. A sensor signal may include any signal form described in this disclosure, for example digital, analog, optical, electrical, fluidic, and the like. In some cases, a sensor, a circuit, and/or a controller may perform one or more signal processing steps on a signal. For instance, sensor, circuit, and/or controller may analyze, modify, and/or synthesize a signal in order to improve the signal, for instance by improving transmission, storage efficiency, or signal to noise ratio.

In one or more embodiments, MMU 116 is configured to transmit a measurement datum of battery module 204. MMU 116 may generate an output signal such as measurement datum that includes information regarding detected measurement characteristic. For the purposes of this disclosure, "measurement datum" is an electronic signal representing an information and/or a parameter of a detected electrical and/or physical characteristic and/or phenomenon correlated with a condition state of battery pack 104. For example, measurement datum may include data of a measurement characteristic regarding a detected temperature of a battery cell. In one or more embodiments, measurement datum may be transmitted by MMU 116 to PMU 100 so that PMU 100 may receive measurement datum, as discussed further in this disclosure. For example, MMU 116 may transmit measurement data to a controller 112 of PMU 100.

In one or more embodiments, MMU 116 may include a plurality of MMUs. For instance, and without limitation, each battery module 204a-n may include one or more MMUs 116. For example, and without limitation, each battery module 204a-n may include two MMUs 116a,b. MMUs 116a,b may be positioned on opposing sides of battery module 204. Battery module 204 may include a plurality of MMUs to create redundancy so that, if one MMU fails or malfunctions, another MMU may still operate properly. In one or more nonlimiting exemplary embodiments, MMU 116 may include mature technology so that there is a low risk. Furthermore, MMU 116 may not include software, for example, to avoid complications often associated with programming. MMU 116 is configured to monitor and balance all battery cell groups of battery pack 104 during charging of battery pack 104. For instance, and without limitation, MMU 116 may monitor a temperature of battery module 204 and/or a battery cell of battery module 204. For example, and without limitation, MMU 116 may monitor a battery cell group temperature. In another example, and without limitation, MMU 116 may monitor a terminal temperature to, for example, detect a poor HV electrical connection. In one or more embodiments, an MMU 116 may be indirectly connected to PMU 100. In other embodiments, MMU 116 may be directly connected to PMU 100. In one or more embodiments, MMU 116 may be communicatively connected to an adjacent MMU 116.

Still referring to FIG. 2, battery management component 214 may include PMU 100, which is communicatively connected to MMU 116. As previously discussed in this disclosure, PMU 100 includes a controller 112, which is configured to receive measurement datum from MMU 116. For example, PMU 100*a* may receive a plurality of measurement data from MMU 116*a*. Similarly, PMU 100*b* may receive a plurality of measurement data from MMU 116*b*. In one or more embodiments, PMU 100 may receive measurement datum from MMU 116 via communicative connections. For example, PMU 100 may receive measurement datum from MMU 116 via an isoSPI communications interface.

In one or more embodiments, battery management component 214 may include a plurality of PMUs 100. For instance, and without limitation, battery management component 214 may include a pair of PMUs. For example, and without limitation, battery management component 214 may include a first PMU 100*a* and a second PMU 100*b*, which are each disposed in or on battery pack 104 and may be physically isolated from each other. "Physical isolation", for the purposes of this disclosure, refer to a first system's components, communicative connection, and any other constituent parts, whether software or hardware, are separated from a second system's components, communicative coupling, and any other constituent parts, whether software or hardware, respectively. Continuing in reference to the non-limiting exemplary embodiment, first PMU 100*a* and second PMU 100*b* may perform the same or different functions. For example, and without limitation, the first and second PMUs 100*a,b* may perform the same, and therefore, redundant functions. Thus, if one PMU 100*a/b* fails or malfunctions, in whole or in part, the other PMU 100*b/a* may still be operating properly and therefore battery management component 214 may still operate and function properly for battery pack 104. One of ordinary skill in the art would understand that the terms "first" and "second" do not refer to either PMU as primary or secondary. In non-limiting embodiments, the first and second PMUs 100*a,b*, due to their physical isolation, may be configured to withstand malfunctions or failures in the other system and survive and operate. Provisions may be made to shield first PMU 100*a* from PMU 100*b* other than physical location, such as structures and circuit fuses. In non-limiting embodiments, first PMU 100*a*, second PMU 100*b*, or subcomponents thereof may be disposed on an internal component or set of components within battery pack 104, such as on battery module sense board, as discussed further below in this disclosure.

Still referring to FIG. 2, first PMU 100*a* may be electrically isolated from second PMU 100*b*. "Electrical isolation", for the purposes of this disclosure, refer to a first system's separation of components carrying electrical signals or electrical energy from a second system's components. First PMU 100*a* may suffer an electrical catastrophe, rendering it inoperable, and due to electrical isolation, second PMU 100*b* may still continue to operate and function normally, allowing for continued management of battery pack 104 of electric aircraft 208. Shielding such as structural components, material selection, a combination thereof, or another undisclosed method of electrical isolation and insulation may be used, in nonlimiting embodiments. For example, and without limitation, a rubber or other electrically insulating material component may be disposed between electrical components of first and second PMUs 100*a,b*, preventing electrical energy to be conducted through it, isolating the first and second PMUs 100*a,b* form each other.

Still referring to FIG. 2, high voltage disconnect 152 is communicatively connected to battery module 108, wherein high voltage disconnect 152 is configured to terminate power supply connection 212 between battery module 204 and electric aircraft 108 in response to receiving action command from PMU 100. PMU 100 may be configured to determine a critical event element, such as high shock/drop, overtemperature, undervoltage, contactor welding, and the like. High voltage disconnect 132 is configured to receive action command generated by PMU 100 and lock out battery pack 104 for maintenance in response to received action command. In one or more embodiments, PMU 100 may create a lockout flag, which may be stored persistently in in memory component 120. For instance, and without limitation, lockout flag may be stored in a storage component and/or device that retains information after being powered down. For example, and without limitation, memory component 120 may be a flash, hard disk memory, secondary memory, or the like. A lockout flag may include an indicator alerting a user of termination of power supply connection 212 by high voltage disconnect 152. For instance, and without limitation, a lockout flag may be saved in a database of memory component 120 of PMU 100 so that, despite rebooting battery pack 104 or complete loss of power of battery pack 104, power supply connection remains terminated and an alert regarding the termination remains. In one or more embodiments, lockout flag cannot be removed until a critical event element is no longer determined by controller 212. For, example, PMU 100 may be continuously updating an operating condition and determining if operating condition is outside of a predetermined threshold. In one or more embodiments, lockout flag may include an alert on a graphic user interface of, for example, a remote computing device, such as a mobile device, tablet, laptop, desktop and the like. In other embodiments, lockout flag may be indicated to a user via an illuminated LED that is remote or locally located on battery pack 104. In one or more embodiments, PMU 100 may include control of cell group balancing via MMUs, control of contactors (high voltage connections, etc.) control of welding detection, control of pyro fuses, and the like.

Figure 3:
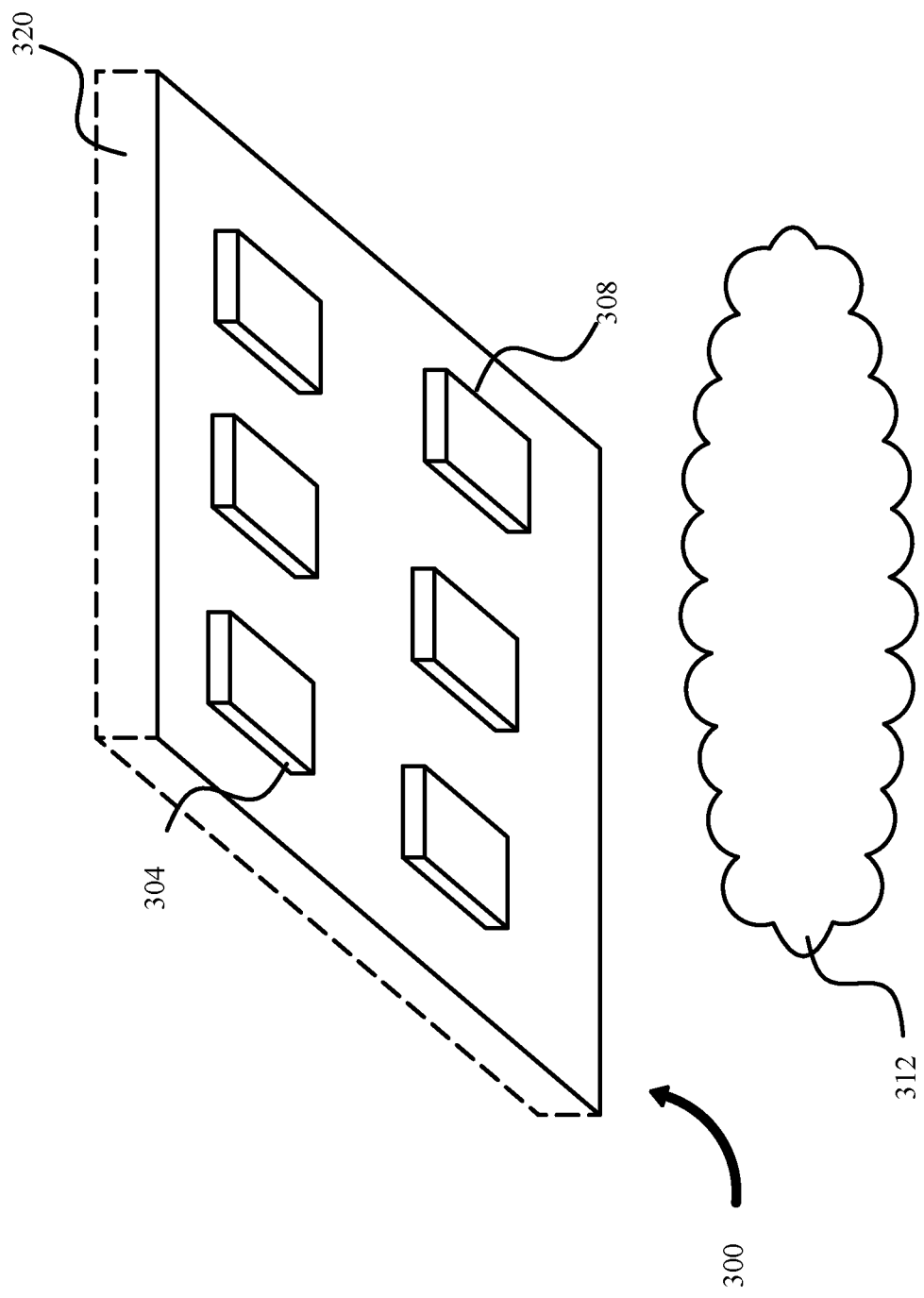
FIG. 3 is a block diagram of an exemplary embodiment of a battery pack in one or more aspects of the present disclosure.

Referring now to FIG. 3, an embodiment of sensor suite 300 is presented. The herein disclosed system and method may comprise a plurality of sensors in the form of individual sensors or a sensor suite working in tandem or individually. A sensor suite may include a plurality of independent sensors, as described herein, where any number of the described sensors may be used to detect any number of physical or electrical quantities associated with an aircraft power system or an electrical energy storage system. Independent sensors may include separate sensors measuring physical or electrical quantities that may be powered by and/or in communication with circuits independently, where each may signal sensor output to a control circuit such as a user graphical interface. In a non-limiting example, there may be four independent sensors housed in and/or on battery pack 104 measuring temperature, electrical characteristic such as voltage, amperage, resistance, or impedance, or any other parameters and/or quantities as described in this disclosure. In an embodiment, use of a plurality of independent sensors may result in redundancy configured to employ more than one sensor that measures the same phenomenon, those sensors being of the same type, a combination of, or another type of sensor not disclosed, so that in the event one sensor fails, the ability of battery management system 100 and/or user to detect phenomenon is maintained and in a non-limiting example, a user alter aircraft usage pursuant to sensor readings.

Sensor suite 300 may be suitable for use as sensor 108 of MMU 116 or may be directly connected to PMU 100 as disclosed with reference to FIG. 1 hereinabove. Sensor suite 300 includes a moisture sensor 304. "Moisture", as used in this disclosure, is the presence of water, this may include vaporized water in air, condensation on the surfaces of objects, or concentrations of liquid water. Moisture may include humidity. "Humidity", as used in this disclosure, is the property of a gaseous medium (almost always air) to hold water in the form of vapor. An amount of water vapor contained within a parcel of air can vary significantly. Water vapor is generally invisible to the human eye and may be damaging to electrical components. There are three primary measurements of humidity, absolute, relative, specific humidity. "Absolute humidity," for the purposes of this disclosure, describes the water content of air and is expressed in either grams per cubic meters or grams per kilogram. "Relative humidity", for the purposes of this disclosure, is expressed as a percentage, indicating a present stat of absolute humidity relative to a maximum humidity given the same temperature. "Specific humidity", for the purposes of this disclosure, is the ratio of water vapor mass to total moist air parcel mass, where parcel is a given portion of a gaseous medium. Moisture sensor 304 may be psychrometer. Moisture sensor 304 may be a hygrometer. Moisture sensor 304 may be configured to act as or include a humidistat. A "humidistat", for the purposes of this disclosure, is a humidity-triggered switch, often used to control another electronic device. Moisture sensor 304 may use capacitance to measure relative humidity and include in itself, or as an external component, include a device to convert relative humidity measurements to absolute humidity measurements. "Capacitance", for the purposes of this disclosure, is the ability of a system to store an electric charge, in this case the system is a parcel of air which may be near, adjacent to, or above a battery cell.

With continued reference to FIG. 3, sensor suite 300 may include electrical sensors 308. Electrical sensors 308 may be configured to measure voltage across a component, electrical current through a component, and resistance of a component. Electrical sensors 308 may include separate sensors to measure each of the previously disclosed electrical characteristics such as voltmeter, ammeter, and ohmmeter, respectively.

Alternatively or additionally, and with continued reference to FIG. 3, sensor suite 300 include a sensor or plurality thereof that may detect voltage and direct the charging of individual battery cells according to charge level; detection may be performed using any suitable component, set of components, and/or mechanism for direct or indirect measurement and/or detection of voltage levels, including without limitation comparators, analog to digital converters, any form of voltmeter, or the like. Sensor suite 300 and/or a control circuit incorporated therein and/or communicatively connected thereto may be configured to adjust charge to one or more battery cells as a function of a charge level and/or a detected parameter. For instance, and without limitation, sensor suite 300 may be configured to determine that a charge level of a battery cell is high based on a detected voltage level of that battery cell or portion of the battery pack. Sensor suite 300 may alternatively or additionally detect a charge reduction event, defined for purposes of this disclosure as any temporary or permanent state of a battery cell requiring reduction or cessation of charging; a charge reduction event may include a cell being fully charged and/or a cell undergoing a physical and/or electrical process that makes continued charging at a current voltage and/or current level inadvisable due to a risk that the cell will be damaged, will overheat, or the like. Detection of a charge reduction event may include detection of a temperature, of the cell above a threshold level, detection of a voltage and/or resistance level above or below a threshold, or the like. Sensor suite 300 may include digital sensors, analog sensors, or a combination thereof. Sensor suite 300 may include digital-to-analog converters (DAC), analog-to-digital converters (ADC, A/D, A-to-D), a combination thereof, or other signal conditioning components used in transmission of a first plurality of battery pack data 128 to a destination over wireless or wired connection.

With continued reference to FIG. 3, sensor suite 300 may include thermocouples, thermistors, thermometers, passive infrared sensors, resistance temperature sensors (RTD's), semiconductor based integrated circuits (IC), a combination thereof or another undisclosed sensor type, alone or in combination. Temperature, for the purposes of this disclosure, and as would be appreciated by someone of ordinary skill in the art, is a measure of the heat energy of a system. Temperature, as measured by any number or combinations of sensors present within sensor suite 300, may be measured in Fahrenheit (° F.), Celsius (° C.), Kelvin (° K), or another scale alone or in combination. The temperature measured by sensors may comprise electrical signals which are transmitted to their appropriate destination wireless or through a wired connection.

With continued reference to FIG. 3, sensor suite 300 may include a sensor configured to detect gas that may be emitted during or after a cell failure. "Cell failure", for the purposes of this disclosure, refers to a malfunction of a battery cell, which may be an electrochemical cell, that renders the cell inoperable for its designed function, namely providing electrical energy to at least a portion of an electric aircraft. Byproducts of cell failure 312 may include gaseous discharge including oxygen, hydrogen, carbon dioxide, methane, carbon monoxide, a combination thereof, or another undisclosed gas, alone or in combination. Further the sensor configured to detect vent gas from electrochemical cells may comprise a gas detector. For the purposes of this disclosure, a "gas detector" is a device used to detect a gas is present in an area. Gas detectors, and more specifically, the gas sensor that may be used in sensor suite 300, may be configured to detect combustible, flammable, toxic, oxygen depleted, a combination thereof, or another type of gas alone or in combination. The gas sensor that may be present in sensor suite 300 may include a combustible gas, photoionization detectors, electrochemical gas sensors, ultrasonic sensors, metal-oxide-semiconductor (MOS) sensors, infrared imaging sensors, a combination thereof, or another undisclosed type of gas sensor alone or in combination. Sensor suite 300 may include sensors that are configured to detect non-gaseous byproducts of cell failure 312 including, in non-limiting examples, liquid chemical leaks including aqueous alkaline solution, ionomer, molten phosphoric acid, liquid electrolytes with redox shuttle and ionomer, and salt water, among others. Sensor suite 200 may include sensors that are configured to detect non-gaseous byproducts of cell failure 312 including, in non-limiting examples, electrical anomalies as detected by any of the previous disclosed sensors or components.

With continued reference to FIG. 3, sensor suite 300 may be configured to detect events where voltage nears an upper voltage threshold or lower voltage threshold. The upper voltage threshold may be stored in memory component 120 for comparison with an instant measurement taken by any combination of sensors present within sensor suite 300. The upper voltage threshold may be calculated and calibrated based on factors relating to battery cell health, maintenance history, location within battery pack, designed application, and type, among others. Sensor suite 300 may measure voltage at an instant, over a period of time, or periodically. Sensor suite 300 may be configured to operate at any of these detection modes, switch between modes, or simultaneous measure in more than one mode. In one or more exemplary embodiments, PMU 100 may determine, using sensor suite 300, a critical event element where voltage nears the lower voltage threshold. The lower voltage threshold may indicate power loss to or from an individual battery cell or portion of the battery pack. PMU 100 may determine through sensor suite 300 critical event elements where voltage exceeds the upper and lower voltage threshold. Events where voltage exceeds the upper and lower voltage threshold may indicate battery cell failure or electrical anomalies that could lead to potentially dangerous situations for aircraft and personnel that may be present in or near its operation.

In one or more embodiments, sensor suite 300 may include an inertial measurement unit (IMU). In one or more embodiments, an IMU may be configured to detect a change in specific force of a body. An IMU may include an accelerometer, a gyro sensor, a magnetometer, an E-compass, a G-sensor, a geomagnetic sensor, and the like. An IMU may be configured to obtain measurement datum. PMU 100 may determine a critical event element by if, for example, an accelerometer of sensor suite 300 detects a force experienced by battery pack 104 that exceeds a predetermined threshold.

Figure 4:
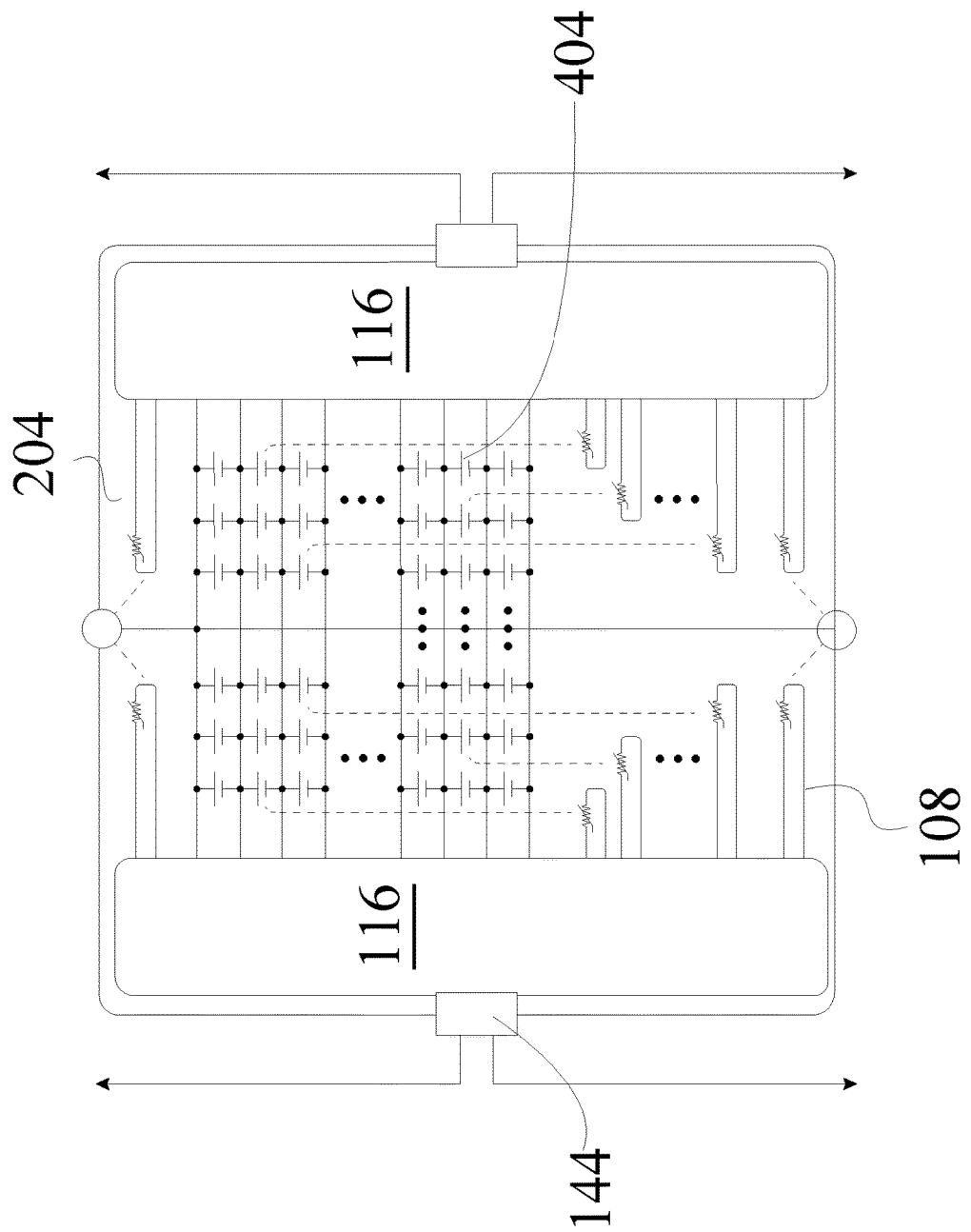
FIG. 4 is a block diagram of an exemplary embodiment of a module monitor unit in one or more aspects of the present disclosure.

With reference to FIG. 4, an exemplary embodiment of an MMU 116 is shown in accordance with one or more embodiments of the present disclosure. MMU 116 may monitor battery cells 404. As previously mentioned, MMU 116 may include one or more sensors. For example, MMU 116 may include resistors to detect a temperature of a corresponding battery module 204. MMU 116 may also monitor all battery cells 404. For example, MMU 116 may detect if one cell as more power than another cell of battery module 204 during recharging.

As previously mentioned, battery module 204 may include a plurality of MMUs 124. For example, battery module 204 may include a left and a right MMU on opposing sides of battery module 204 to create redundancy, as previously discussed in this disclosure. In one or more embodiments, each MMU 116 may communicate with another MMU 116 and/or PMU 100 via communication component 144. For example, an MMU 116 may communicate with an adjacent MMU 116 using an isoSPI connection. Each MMU may use a wireless and/or wired connection to communicated with each other.

In one or more embodiments, MMU 116 may include one or more circuits and/or circuit elements, including without limitation a printed circuit board component, aligned with a first side of battery module 204 and the openings correlating to battery cells 404. In one or more embodiments, MMU 116 may include, without limitation, a control circuit configured to perform and/or direct any actions performed by MMU 116 and/or any other component and/or element described in this disclosure; control circuit may include any analog or digital control circuit, including without limitation a combinational and/or synchronous logic circuit, a processor, microprocessor, microcontroller, or the like.

Still referring to FIG. 4, MMU 116 may include sensor 108 or sensor suite 300 configured to measure physical and/or electrical parameters, such as without limitation temperature, voltage, orientation, or the like, of one or more battery cells 404. MMU 116 and/or a control circuit incorporated therein and/or communicatively connected thereto, may further be configured to detect a measurement datum of each battery cell 404, which controller 112 of PMU 100 may ultimately use to determine a failure within each battery cell 404, such as critical event element. Cell failure may be characterized by a spike in temperature and MMU 116 may be configured to detect that increase, which in turn, PMU 100 uses to determine a critical event element and generate signals, to disconnect power supply connection 212 (shown in FIG. 2) and to notify users, support personnel, safety personnel, maintainers, operators, emergency personnel, aircraft computers, or a combination thereof. In one or more embodiments, measurement data of MMU 116 may be stored in memory component 120.

Figure 5A:
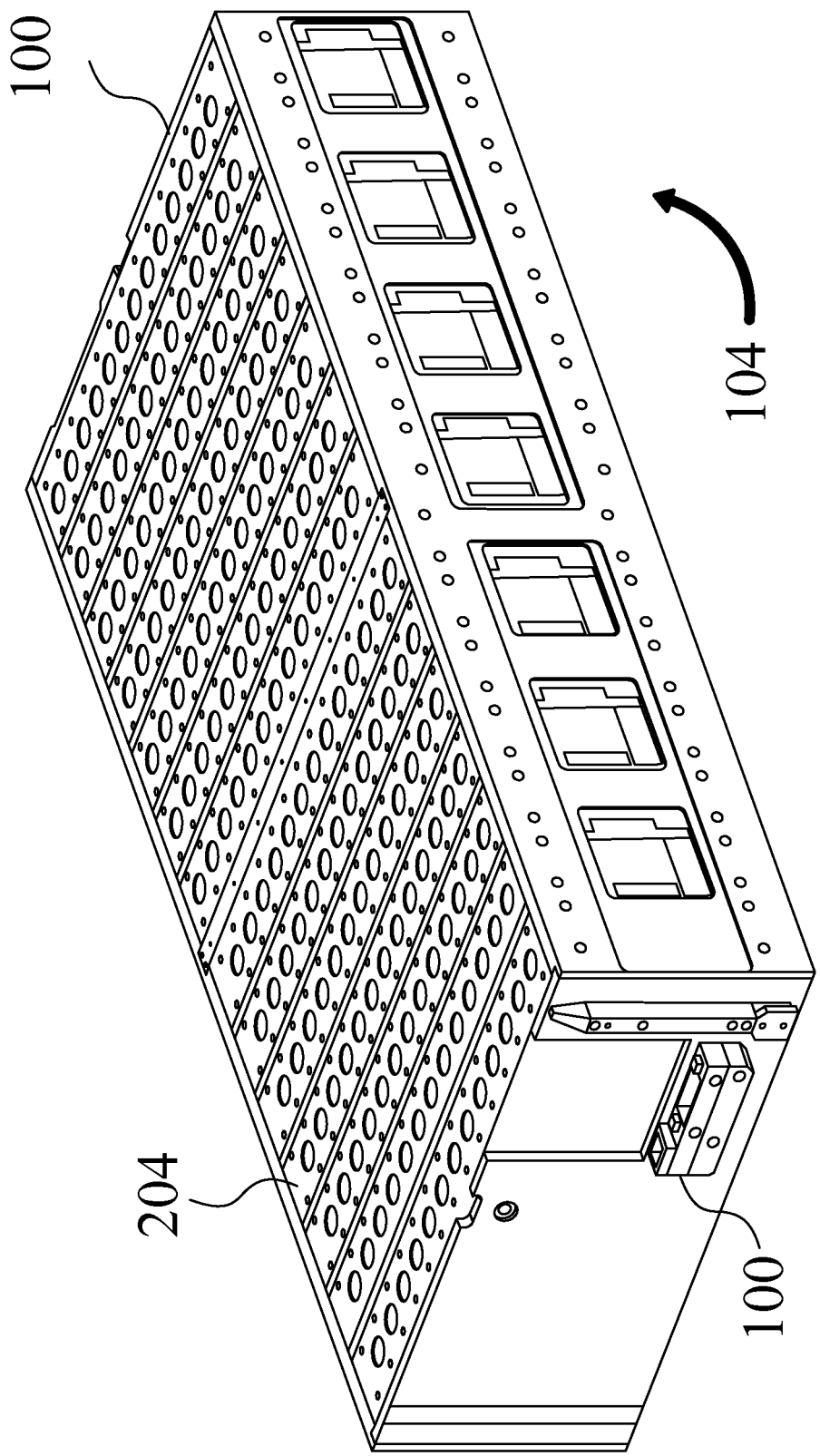
FIGS. 5A and 5B are illustrations of exemplary embodiments of a battery pack configured for use in an electric aircraft in isometric view in accordance with one or more aspects of the present disclosure.
Figure 5B:
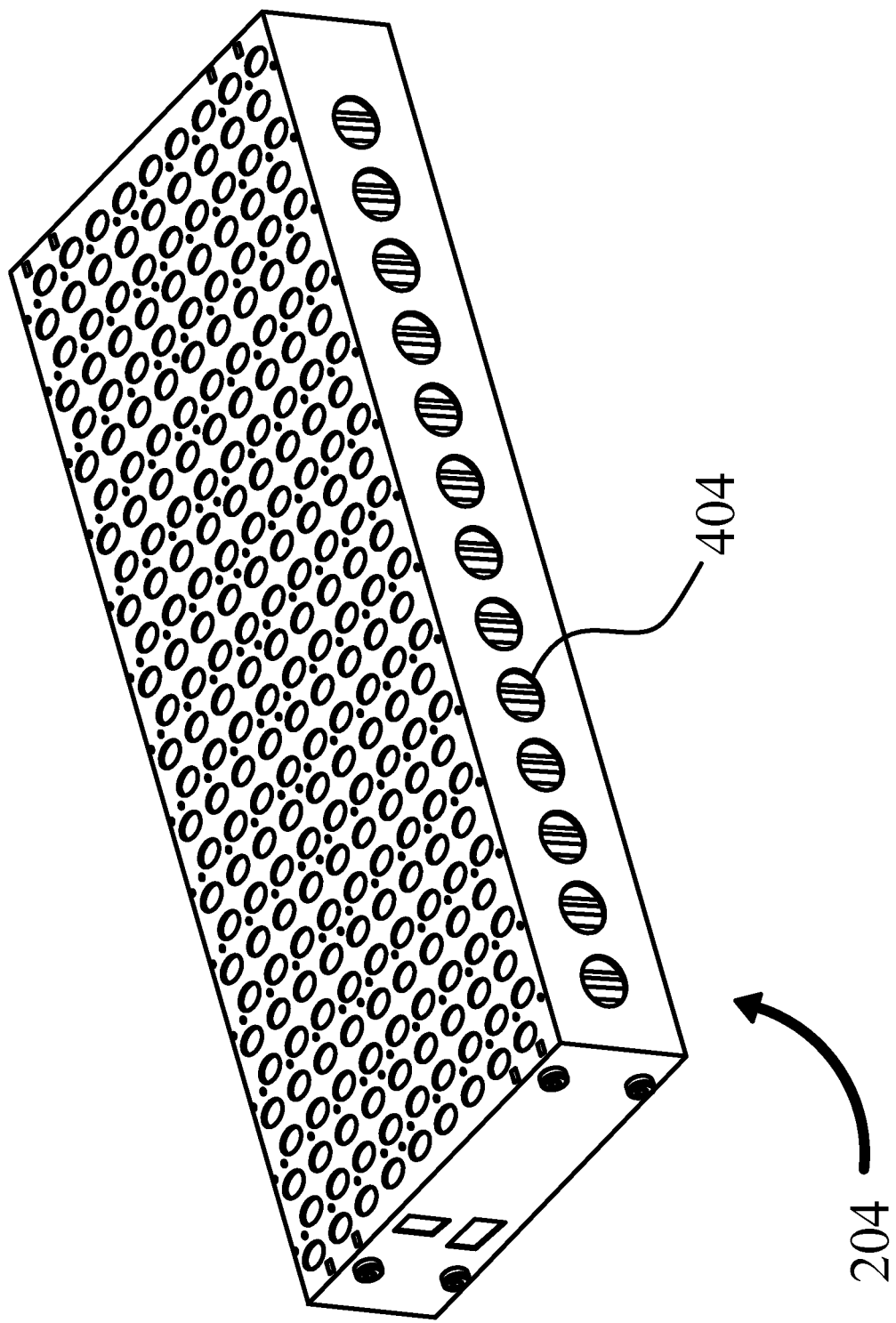

Now referring to FIGS. 5A and 5B, an exemplary embodiment of battery pack 104 is illustrated. Battery pack 104 is a power source that may be configured to store electrical energy in the form of a plurality of battery modules, which themselves include of a plurality of electrochemical cells. These cells may utilize electrochemical cells, galvanic cells, electrolytic cells, fuel cells, flow cells, and/or voltaic cells. In general, an electrochemical cell is a device capable of generating electrical energy from chemical reactions or using electrical energy to cause chemical reactions, this disclosure will focus on the former. Voltaic or galvanic cells are electrochemical cells that generate electric current from chemical reactions, while electrolytic cells generate chemical reactions via electrolysis. In general, the term 'battery' is used as a collection of cells connected in series or parallel to each other. A battery cell may, when used in conjunction with other cells, may be electrically connected in series, in parallel or a combination of series and parallel. Series connection includes wiring a first terminal of a first cell to a second terminal of a second cell and further configured to include a single conductive path for electricity to flow while maintaining the same current (measured in Amperes) through any component in the circuit. A battery cell may use the term 'wired', but one of ordinary skill in the art would appreciate that this term is synonymous with 'electrically connected', and that there are many ways to couple electrical elements like battery cells together. An example of a connector that does not include wires may be prefabricated terminals of a first gender that mate with a second terminal with a second gender. Battery cells may be wired in parallel. Parallel connection includes wiring a first and second terminal of a first battery cell to a first and second terminal of a second battery cell and further configured to include more than one conductive path for electricity to flow while maintaining the same voltage (measured in Volts) across any component in the circuit. Battery cells may be wired in a series-parallel circuit which combines characteristics of the constituent circuit types to this combination circuit. Battery cells may be electrically connected in a virtually unlimited arrangement which may confer onto the system the electrical advantages associated with that arrangement such as high-voltage applications, high-current applications, or the like. In an exemplary embodiment, battery pack 104 include 196 battery cells in series and 18 battery cells in parallel. This is, as someone of ordinary skill in the art would appreciate, is only an example and battery pack 104 may be configured to have a near limitless arrangement of battery cell configurations.

With continued reference to FIG. 5, battery pack 104 may include a plurality of battery modules. The battery modules may be wired together in series and in parallel. Battery pack 104 may include a center sheet which may include a thin barrier. The barrier may include a fuse connecting battery modules on either side of the center sheet. The fuse may be disposed in or on the center sheet and configured to connect to an electric circuit comprising a first battery module and therefore battery unit and cells. In general, and for the purposes of this disclosure, a fuse is an electrical safety device that operate to provide overcurrent protection of an electrical circuit. As a sacrificial device, its essential component is metal wire or strip that melts when too much current flows through it, thereby interrupting energy flow. The fuse may include a thermal fuse, mechanical fuse, blade fuse, expulsion fuse, spark gap surge arrestor, varistor, or a combination thereof.

Battery pack 104 may also include a side wall includes a laminate of a plurality of layers configured to thermally insulate the plurality of battery modules from external components of battery pack 104. The side wall layers may include materials which possess characteristics suitable for thermal insulation as described in the entirety of this disclosure like fiberglass, air, iron fibers, polystyrene foam, and thin plastic films, to name a few. The side wall may additionally or alternatively electrically insulate the plurality of battery modules from external components of battery pack 104 and the layers of which may include polyvinyl chloride (PVC), glass, asbestos, rigid laminate, varnish, resin, paper, Teflon, rubber, and mechanical lamina. The center sheet may be mechanically coupled to the side wall in any manner described in the entirety of this disclosure or otherwise undisclosed methods, alone or in combination. The side wall may include a feature for alignment and coupling to the center sheet. This feature may include a cutout, slots, holes, bosses, ridges, channels, and/or other undisclosed mechanical features, alone or in combination.

With continued reference to FIG. 5, battery pack 104 may also include an end panel including a plurality of electrical connectors and further configured to fix battery pack 104 in alignment with at least the side wall. The end panel may include a plurality of electrical connectors of a first gender configured to electrically and mechanically couple to electrical connectors of a second gender. The end panel may be configured to convey electrical energy from battery cells to at least a portion of an eVTOL aircraft. Electrical energy may be configured to power at least a portion of an eVTOL aircraft or include signals to notify aircraft computers, personnel, users, pilots, and any others of information regarding battery health, emergencies, and/or electrical characteristics. The plurality of electrical connectors may include blind mate connectors, plug and socket connectors, screw terminals, ring and spade connectors, blade connectors, and/or an undisclosed type alone or in combination. The electrical connectors of which the end panel includes may be configured for power and communication purposes. A first end of the end panel may be configured to mechanically couple to a first end of a first side wall by a snap attachment mechanism, similar to end cap and side panel configuration utilized in the battery module. To reiterate, a protrusion disposed in or on the end panel may be captured, at least in part, by a receptacle disposed in or on the side wall. A second end of end the panel may be mechanically coupled to a second end of a second side wall in a similar or the same mechanism.

With continued reference to FIG. 5, sensor suite 300 may be disposed in or on a portion of battery pack 104 near battery modules or battery cells. In one or more embodiments, PMU 100 may be configured to communicate with an electric aircraft, such as a flight controller of electric aircraft 208, using a controller area network (CAN), such as by using a CAN transceiver 176 (shown in FIG. 1). In one or more embodiments, controller area network may include a bus. Bus may include an electrical bus. Bus may refer to power busses, audio busses, video busses, computing address busses, and/or data busses. Bus may be additionally or alternatively responsible for conveying electrical signals generated by any number of components within battery pack 104 to any destination on or offboard an electric aircraft. Battery management component may include wiring or conductive surfaces only in portions required to electrically couple bus to electrical power or necessary circuits to convey that power or signals to their destinations.

Outputs from sensors or any other component present within system may be analog or digital. Onboard or remotely located processors can convert those output signals from sensor suite to a usable form by the destination of those signals. The usable form of output signals from sensors, through processor may be either digital, analog, a combination thereof or an otherwise unstated form. Processing may be configured to trim, offset, or otherwise compensate the outputs of sensor suite. Based on sensor output, the processor can determine the output to send to downstream component. Processor can include signal amplification, operational amplifier (Op-Amp), filter, digital/analog conversion, linearization circuit, current-voltage change circuits, resistance change circuits such as Wheatstone Bridge, an error compensator circuit, a combination thereof or otherwise undisclosed components.

With continued reference to FIG. 5, any of the disclosed components or systems, namely battery pack 104, PMU 100, and/or battery cell 404 may incorporate provisions to dissipate heat energy present due to electrical resistance in integral circuit. Battery pack 104 includes one or more battery element modules wired in series and/or parallel. The presence of a voltage difference and associated amperage inevitably will increase heat energy present in and around battery pack 104 as a whole. The presence of heat energy in a power system is potentially dangerous by introducing energy possibly sufficient to damage mechanical, electrical, and/or other systems present in at least a portion of electric aircraft 208. Battery pack 104 may include mechanical design elements, one of ordinary skill in the art, may thermodynamically dissipate heat energy away from battery pack 104. The mechanical design may include, but is not limited to, slots, fins, heat sinks, perforations, a combination thereof, or another undisclosed element.

Heat dissipation may include material selection beneficial to move heat energy in a suitable manner for operation of battery pack 104. Certain materials with specific atomic structures and therefore specific elemental or alloyed properties and characteristics may be selected in construction of battery pack 104 to transfer heat energy out of a vulnerable location or selected to withstand certain levels of heat energy output that may potentially damage an otherwise unprotected component. One of ordinary skill in the art, after reading the entirety of this disclosure would understand that material selection may include titanium, steel alloys, nickel, copper, nickel-copper alloys such as Monel, tantalum and tantalum alloys, tungsten and tungsten alloys such as Inconel, a combination thereof, or another undisclosed material or combination thereof. Heat dissipation may include a combination of mechanical design and material selection. The responsibility of heat dissipation may fall upon the material selection and design as disclosed above in regard to any component disclosed in this paper. The battery pack 104 may include similar or identical features and materials ascribed to battery pack 104 in order to manage the heat energy produced by these systems and components.

According to embodiments, the circuitry disposed within or on battery pack 104 may be shielded from electromagnetic interference. The battery elements and associated circuitry may be shielded by material such as mylar, aluminum, copper a combination thereof, or another suitable material. The battery pack 104 and associated circuitry may include one or more of the aforementioned materials in their inherent construction or additionally added after manufacture for the express purpose of shielding a vulnerable component. The battery pack 104 and associated circuitry may alternatively or additionally be shielded by location. Electrochemical interference shielding by location includes a design configured to separate a potentially vulnerable component from energy that may compromise the function of said component. The location of vulnerable component may be a physical uninterrupted distance away from an interfering energy source, or location configured to include a shielding element between energy source and target component. The shielding may include an aforementioned material in this section, a mechanical design configured to dissipate the interfering energy, and/or a combination thereof. The shielding comprising material, location and additional shielding elements may defend a vulnerable component from one or more types of energy at a single time and instance or include separate shielding for individual potentially interfering energies.

Figure 6:
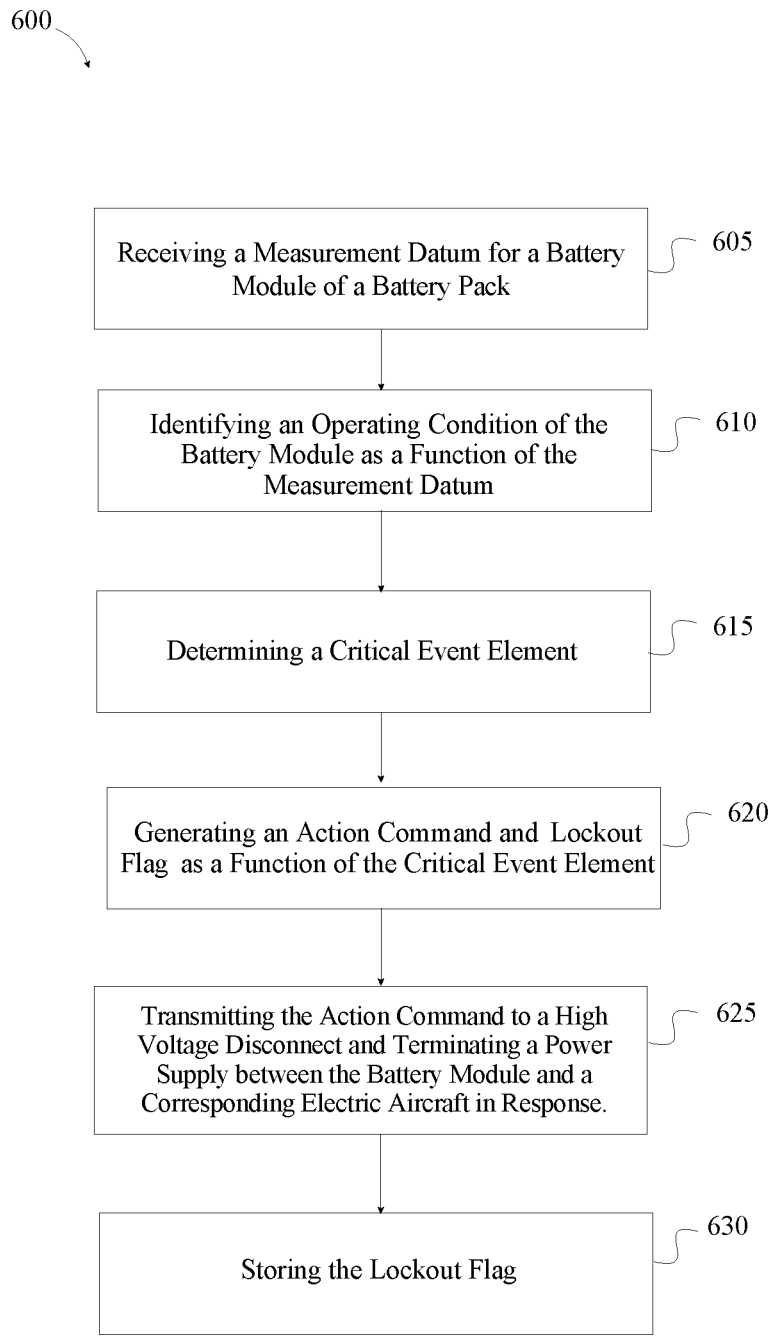
FIG. 6 is a flow chart of an exemplary embodiment of a method of battery pack management in one or more aspects of the present disclosure.

Referring now to FIG. 6, a flow chart showing an exemplary method 600 of battery pack management using PMU 100 is shown in accordance with one or more embodiments of the present disclosure. In one or more embodiments, step 605 of method 600 includes receiving, by controller 112 of PMU 100, a measurement datum for a battery module 204 of a battery pack 104.

In one or more embodiments, step 610 of method 600 includes identifying, by controller 112, an operating condition of battery module 204 as a function of the measurement datum.

In one or more embodiments, step 615 of method 600 includes determining, by controller 112, a critical event element if the operating condition is outside of a predetermined threshold.

In one or more embodiments, step 620 of method 600 includes generating, by controller 112, an action command and lockout flag as a function of a critical event element is determined by the controller 112.

In one or more embodiments, step 625 of method 600 includes transmitting, by communication component 144 of PMU 100, the action command to a high voltage disconnect of the battery module, wherein the action command configures the high voltage disconnect to terminate a power supply between the battery module and a corresponding electric aircraft.

In one or more embodiments, step 630 of method 600 includes storing, by a memory component of PMU 100, the lockout flag persistently. For instance, and without limitation, lockout flag may be stored in a memory component that retains information despite a loss of power. For example, and without limitation, memory component 120 may include a non-volatile memory (NVM). In one or more non-limiting embodiments, memory component 120 may include including a flash memory storage, such as NAND flash, a solid-state drive (SSD), a read-only memory (ROM), an EPROM (erasable programmable ROM), a EEPROM (electrically erasable programmable ROM), a ferroelectric RAM, a disk storage, and the like.

Figure 7:
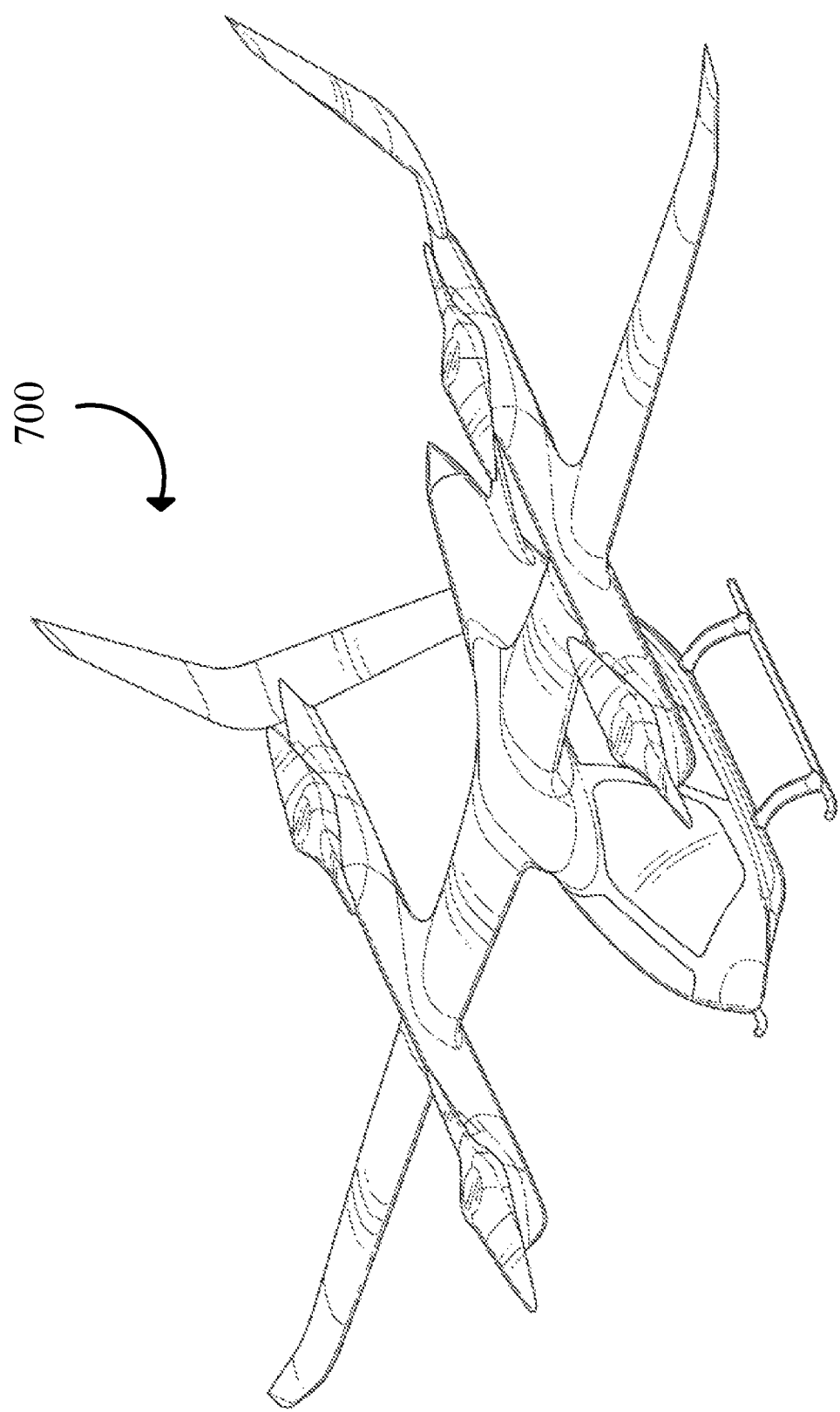
FIG. 7 is an illustration of an embodiment of an electric aircraft in one or more aspects of the present disclosure.

Referring now to FIG. 7, an embodiment of an electric aircraft 700 is presented in accordance with one or more embodiments of the present disclosure. Electric aircraft 700 may include a vertical takeoff and landing aircraft (eVTOL). As used herein, a vertical take-off and landing (eVTOL) aircraft is one that can hover, take off, and land vertically. An eVTOL, as used herein, is an electrically powered aircraft typically using an energy source, of a plurality of energy sources to power the aircraft. In order to optimize the power and energy necessary to propel the aircraft. eVTOL may be capable of rotor-based cruising flight, rotor-based takeoff, rotor-based landing, fixed-wing cruising flight, airplane-style takeoff, airplane-style landing, and/or any combination thereof. Rotor-based flight, as described herein, is where the aircraft generated lift and propulsion by way of one or more powered rotors coupled with an engine, such as a "quad copter," multi-rotor helicopter, or other vehicle that maintains its lift primarily using downward thrusting propulsors. Fixed-wing flight, as described herein, is where the aircraft is capable of flight using wings and/or foils that generate life caused by the aircraft's forward airspeed and the shape of the wings and/or foils, such as airplane-style flight.

It is to be noted that any one or more of the aspects and embodiments described herein may be conveniently implemented using one or more machines (e.g., one or more computing devices that are utilized as a user computing device for an electronic document, one or more server devices, such as a document server, etc.) programmed according to the teachings of the present specification, as will be apparent to those of ordinary skill in the computer art. Appropriate software coding can readily be prepared by skilled programmers based on the teachings of the present disclosure, as will be apparent to those of ordinary skill in the software art. Aspects and implementations discussed above employing software and/or software modules may also include appropriate hardware for assisting in the implementation of the machine executable instructions of the software and/or software module.

Such software may be a computer program product that employs a machine-readable storage medium. A machine-readable storage medium may be any medium that is capable of storing and/or encoding a sequence of instructions for execution by a machine (e.g., a computing device) and that causes the machine to perform any one of the methodologies and/or embodiments described herein. Examples of a machine-readable storage medium include, but are not limited to, a magnetic disk, an optical disc (e.g., CD, CD-R, DVD, DVD-R, etc.), a magneto-optical disk, a read-only memory "ROM" device, a random-access memory "RAM" device, a magnetic card, an optical card, a solid-state memory device, an EPROM, an EEPROM, and any combinations thereof. A machine-readable medium, as used herein, is intended to include a single medium as well as a collection of physically separate media, such as, for example, a collection of compact discs or one or more hard disk drives in combination with a computer memory. As used herein, a machine-readable storage medium does not include transitory forms of signal transmission.

Such software may also include information (e.g., data) carried as a data signal on a data carrier, such as a carrier wave. For example, machine-executable information may be included as a data-carrying signal embodied in a data carrier in which the signal encodes a sequence of instruction, or portion thereof, for execution by a machine (e.g., a computing device) and any related information (e.g., data structures and data) that causes the machine to perform any one of the methodologies and/or embodiments described herein.

Examples of a computing device include, but are not limited to, an electronic book reading device, a computer workstation, a terminal computer, a server computer, a handheld device (e.g., a tablet computer, a smartphone, etc.), a web appliance, a network router, a network switch, a network bridge, any machine capable of executing a sequence of instructions that specify an action to be taken by that machine, and any combinations thereof. In one example, a computing device may include and/or be included in a kiosk.

Figure 8:
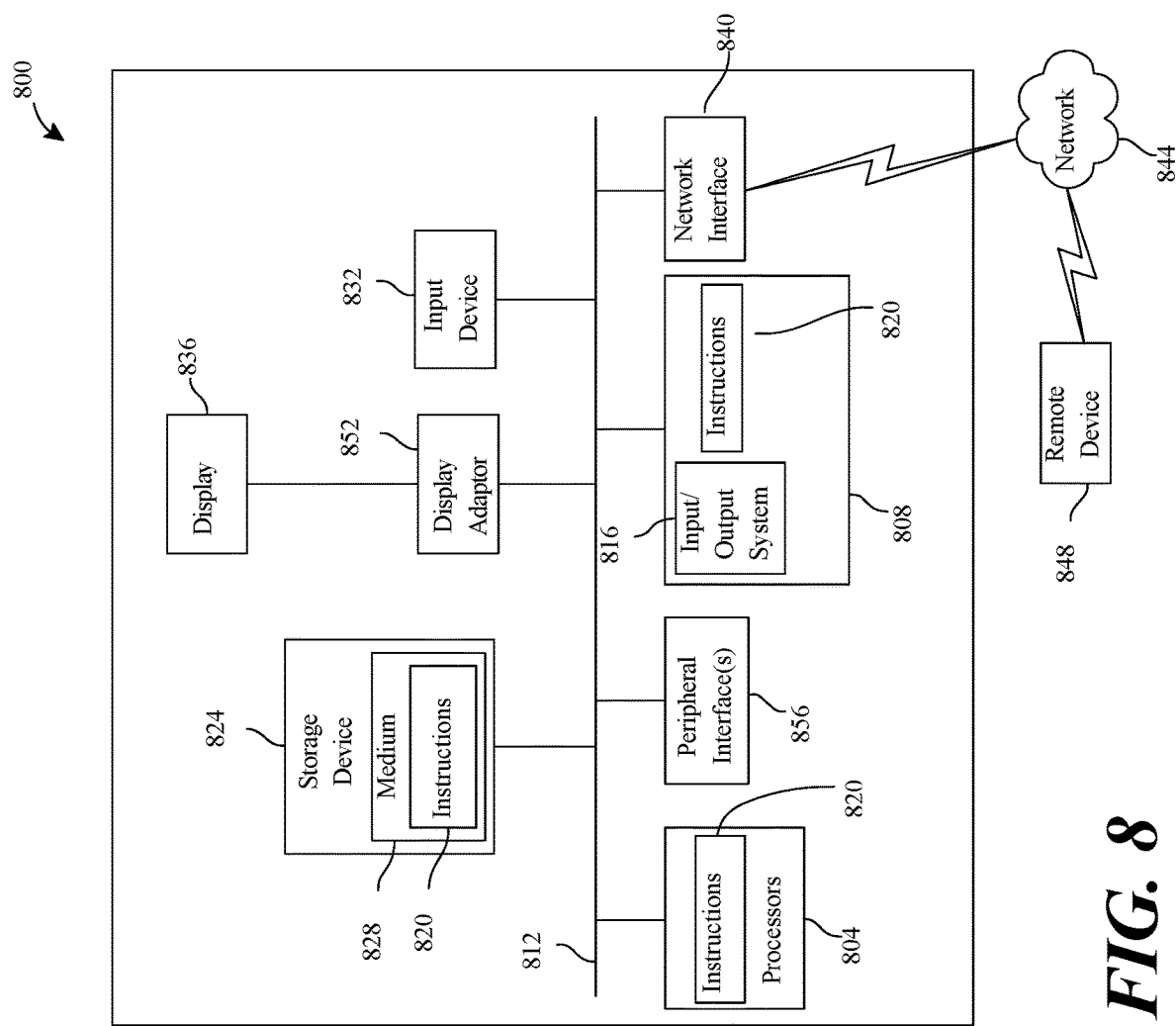
FIG. 8 is a block diagram of a computing system that can be used to implement any one or more of the methodologies disclosed herein and any one or more portions thereof in one or more aspects of the present disclosure.

FIG. 8 shows a diagrammatic representation of one embodiment of a computing device in the exemplary form of a computer system 800 within which a set of instructions for causing a control system to perform any one or more of the aspects and/or methodologies of the present disclosure may be executed. It is also contemplated that multiple computing devices may be utilized to implement a specially configured set of instructions for causing one or more of the devices to perform any one or more of the aspects and/or methodologies of the present disclosure. Computer system 800 includes a processor 804 and a memory 808 that communicate with each other, and with other components, via a bus 812. Bus 812 may include any of several types of bus structures including, but not limited to, a memory bus, a memory controller, a peripheral bus, a local bus, and any combinations thereof, using any of a variety of bus architectures.

Memory 808 may include various components (e.g., machine-readable media) including, but not limited to, a random-access memory component, a read only component, and any combinations thereof. In one example, a basic input/output system 816 (BIOS), including basic routines that help to transfer information between elements within computer system 800, such as during start-up, may be stored in memory 808. Memory 808 may also include (e.g., stored on one or more machine-readable media) instructions (e.g., software) 820 embodying any one or more of the aspects and/or methodologies of the present disclosure. In another example, memory 808 may further include any number of program modules including, but not limited to, an operating system, one or more application programs, other program modules, program data, and any combinations thereof.

Computer system 800 may also include a storage device 824. Examples of a storage device (e.g., storage device 824) include, but are not limited to, a hard disk drive, a magnetic disk drive, an optical disc drive in combination with an optical medium, a solid-state memory device, and any combinations thereof. Storage device 824 may be connected to bus 812 by an appropriate interface (not shown). Example interfaces include, but are not limited to, SCSI, advanced technology attachment (ATA), serial ATA, universal serial bus (USB), IEEE 894 (FIREWIRE), and any combinations thereof. In one example, storage device 824 (or one or more components thereof) may be removably interfaced with computer system 800 (e.g., via an external port connector (not shown)). Particularly, storage device 824 and an associated machine-readable medium 828 may provide nonvolatile and/or volatile storage of machine-readable instructions, data structures, program modules, and/or other data for computer system 800. In one example, software 820 may reside, completely or partially, within machine-readable medium 828. In another example, software 820 may reside, completely or partially, within processor 804.

Computer system 800 may also include an input device 832. In one example, a user of computer system 800 may enter commands and/or other information into computer system 800 via input device 832. Examples of an input device 832 include, but are not limited to, an alpha-numeric input device (e.g., a keyboard), a pointing device, a joystick, a gamepad, an audio input device (e.g., a microphone, a voice response system, etc.), a cursor control device (e.g., a mouse), a touchpad, an optical scanner, a video capture device (e.g., a still camera, a video camera), a touchscreen, and any combinations thereof. Input device 832 may be interfaced to bus 812 via any of a variety of interfaces (not shown) including, but not limited to, a serial interface, a parallel interface, a game port, a USB interface, a FIREWIRE interface, a direct interface to bus 812, and any combinations thereof. Input device 832 may include a touch screen interface that may be a part of or separate from display 836, discussed further below. Input device 832 may be utilized as a user selection device for selecting one or more graphical representations in a graphical interface as described above.

A user may also input commands and/or other information to computer system 800 via storage device 824 (e.g., a removable disk drive, a flash drive, etc.) and/or network interface device 840. A network interface device, such as network interface device 840, may be utilized for connecting computer system 800 to one or more of a variety of networks, such as network 844, and one or more remote devices 848 connected thereto. Examples of a network interface device include, but are not limited to, a network interface card (e.g., a mobile network interface card, a LAN card), a modem, and any combination thereof. Examples of a network include, but are not limited to, a wide area network (e.g., the Internet, an enterprise network), a local area network (e.g., a network associated with an office, a building, a campus or other relatively small geographic space), a telephone network, a data network associated with a telephone/voice provider (e.g., a mobile communications provider data and/or voice network), a direct connection between two computing devices, and any combinations thereof. A network, such as network 844, may employ a wired and/or a wireless mode of communication. In general, any network topology may be used. Information (e.g., data, software 820, etc.) may be communicated to and/or from computer system 800 via network interface device 840.

Computer system 800 may further include a video display adapter 852 for communicating a displayable image to a display device, such as display device 836. Examples of a display device include, but are not limited to, a liquid crystal display (LCD), a cathode ray tube (CRT), a plasma display, a light emitting diode (LED) display, and any combinations thereof. Display adapter 852 and display device 836 may be utilized in combination with processor 804 to provide graphical representations of aspects of the present disclosure. In addition to a display device, computer system. 800 may include one or more other peripheral output devices including, but not limited to, an audio speaker, a printer, and any combinations thereof. Such peripheral output devices may be connected to bus 812 via a peripheral interface 856. Examples of a peripheral interface include, but are not limited to, a serial port, a USB connection, a FIREWIRE connection, a parallel connection, and any combinations thereof.

The foregoing has been a detailed description of illustrative embodiments of the invention. Various modifications and additions can be made without departing from the spirit and scope of this invention. Features of each of the various embodiments described above may be combined with features of other described embodiments as appropriate in order to provide a multiplicity of feature combinations in associated new embodiments. Furthermore, while the foregoing describes a number of separate embodiments, what has been described herein is merely illustrative of the application of the principles of the present invention. Additionally, although particular methods herein may be illustrated and/or described as being performed in a specific order, the ordering is highly variable within ordinary skill to achieve embodiments according to this disclosure. Accordingly, this description is meant to be taken only by way of example, and not to otherwise limit the scope of this invention.

Exemplary embodiments have been disclosed above and illustrated in the accompanying drawings. It will be understood by those skilled in the art that various changes, omissions and additions may be made to that which is specifically disclosed herein without departing from the spirit and scope of the present invention.

What is claimed is:

1. A pack monitoring unit (PMU) for an electric aircraft battery pack, the PMU comprising:
    a controller, wherein the controller is configured to:
        receive a measurement datum for a battery module of a battery pack;
        identify an operating condition of the battery module as a function of the measurement datum;
        determine a critical event element if the operating condition is outside of a predetermined threshold; and
        generate an action command and a lockout flag as a function of the critical event element;
    a communication component, wherein the communication component is configured to transmit the action command to a high voltage disconnect of the battery module, wherein the action command configures the high voltage disconnect to terminate a power supply between the battery module and a corresponding electric aircraft; and
    a memory component, wherein the memory component is configured to store the lockout flag persistently.

2. The PMU of claim 1, wherein the memory component is configured to store the measurement datum.

3. The PMU of claim 1, further comprising a sensor configured to detect the condition parameter of the battery module.

4. The PMU of claim 1, further configured to:
    receive a signal from a module monitor unit (MMU) incorporated in the battery module; and
    detect the condition parameter as a function of the signal.

5. The PMU of claim 1, wherein the predetermined threshold comprises an upper temperature threshold.

6. The PMU of claim 1, wherein the controller is configured to:
    experience a loss of power;
    restart upon restoration of the power;
    retrieve the lockout flag from the memory component; and
    transmit the action command to the high voltage disconnect.

7. The PMU of claim 1, wherein a predetermined threshold comprises a lower threshold.

8. The PMU of claim 1, wherein the condition parameter comprises detection of cell failure byproduct.

9. The PMU of claim 1, further comprising a switching regulator that converts power received from the battery module.

10. The PMU of claim 1, wherein the communication component is a transceiver.

11. A method of battery management using a pack monitoring unit (PMU) for an electric aircraft battery pack, the method comprising:
    receiving, by a controller of a PMU, a measurement datum for a battery module of a battery pack;
    identifying, by the controller, an operating condition of the battery module as a function of the measurement datum;
    determining, by the controller, a critical event element if the operating condition is outside of a predetermined threshold; and
    generating, by the controller, an action command and a lockout flag as a function of the critical event element;
    transmitting, by a communication component of the PMU, the action command to a high voltage disconnect of the battery module, wherein the action command configures the high voltage disconnect to terminate a power supply between the battery module and a corresponding electric aircraft; and
    storing, by a memory component of the PMU, the lockout flag persistently.

12. The method of claim 11, further comprising storing, by the memory component, the measurement datum.

13. The method of claim 11, further comprising detecting, by a sensor of the PMU, the condition parameter of the battery module.

14. The method of claim 11, further comprising:
    receiving a signal from a module monitor unit (MMU) incorporated in the battery module; and
    detecting the condition parameter as a function of the signal.

15. The method of claim 11, wherein the predetermined threshold comprises an upper temperature threshold of the battery module.

16. The method of claim 15, further comprising determining, by the controller, the critical event element when the operating condition comprises a temperature of the battery module that exceeds the upper temperature threshold of the battery module.

17. The method of claim 11, wherein a predetermined threshold comprises a lower threshold.

18. The method of claim 11, wherein the condition parameter comprises detection of cell failure byproduct.

19. The method of claim 11, further comprising a switching regulator that converts power received from the battery module.

20. The method of claim 11, wherein the communication component is a transceiver.

* * * * *